United States Patent [19]

Hanabata et al.

[11] Patent Number: 4,696,886
[45] Date of Patent: Sep. 29, 1987

[54] POSITIVE PHOTORESIST COMPOSITION WITH M-HYDROXY-α-METHYLSTYRENE HOMOPOLYMER AND QUINONEDIAZIDE COMPOUND

[75] Inventors: Makoto Hanabata, Ibaraki; Akihiro Furuta; Seimei Yasui, both of Takarazuka; Kunihiko Tanaka, Nara, all of Japan

[73] Assignee: Sumitomo Chemical Company, Limited, Osaka, Japan

[21] Appl. No.: 748,064

[22] Filed: Jun. 24, 1985

Related U.S. Application Data

[63] Continuation-in-part of Ser. No. 497,912, May 25, 1983, abandoned.

[30] Foreign Application Priority Data

May 25, 1982 [JP] Japan .................................. 57-89482

[51] Int. Cl.⁴ ........................ G03C 1/60; G03C 1/495
[52] U.S. Cl. .................................. 430/192; 430/165; 430/190; 430/193; 430/326
[58] Field of Search ............... 430/192, 190, 165, 326

[56] References Cited

U.S. PATENT DOCUMENTS

| | | | |
|---|---|---|---|
| 3,402,044 | 9/1968 | Steinhoff | 430/192 |
| 3,551,154 | 12/1970 | DiBlas et al. | 430/192 |
| 3,869,292 | 3/1975 | Peters | 430/192 |
| 3,902,906 | 9/1975 | Iwama et al. | 430/192 |
| 4,139,384 | 2/1979 | Iwasaki et al. | 430/190 |
| 4,439,516 | 3/1984 | Cernigliaro et al. | 430/192 |

FOREIGN PATENT DOCUMENTS

| | | | |
|---|---|---|---|
| 76-120713 | 10/1976 | Japan | 430/192 |
| 76-120712 | 10/1976 | Japan | 430/192 |
| 60-35129 | 4/1981 | Japan | 430/270 |
| 7305260 | 5/1972 | Netherlands | 430/192 |

OTHER PUBLICATIONS

Pacansky, J., *IBM Technical Disclosure Bulletin*, vol. 20, No. 7; 12/1977, p. 2809.

Primary Examiner—Charles L. Bowers, Jr.
Attorney, Agent, or Firm—Sughrue, Mion, Zinn, Macpeak and Seas

[57] ABSTRACT

A positive type photoresist composition comprising an m-hydroxy-α-methylstyrene polymer and as a photo-sensitizer a quinonediazide compound is disclosed. A positive type photoresist composition comprising an m-hydroxy-α-methylstyrene polymer, a novolak resin, and as a photo-sensitizer a quinonediazide compound, is also disclosed.

2 Claims, No Drawings

POSITIVE PHOTORESIST COMPOSITION WITH M-HYDROXY-α-METHYLSTYRENE HOMOPOLYMER AND QUINONEDIAZIDE COMPOUND

CROSS REFERENCE OF RELATED APPLICATIONS

This is a continuation-in-part of U.S. patent application Ser. No. 497,912, filed May 25, 1983, abandoned.

FIELD OF THE INVENTION

This invention relates to a positive type photoresist composition.

BACKGROUND OF THE INVENTION

Photo-sensitive compositions containing a compound having a naphthoquinonediazido group or a benzoquinonediazido group have been used as positive type photoresists or positive type PS (presensitized) plates utilizing a phenomenon that when irradiated with a light having a wavelength of 300 to 500 μm, the compositions undergo decomposition of quinonediazido group to produce a carboxyl group whereby the compositions become from alkali-insoluble to alkali-soluble. The compounds having a naphthoquinonediazido group or a benzoquinonediazido group can be obtained by, for example, condensing naphthoquinonediazide-sulfonyl chloride or benzoquinonediazide-sulfonyl chloride with a hydroxy group-containing low molecular weight or high molecular weight compound in the presence of a weak alkali. Examples of the low molecular weight compound include hydroquinone, resorcinol, phloroglucinol, 2,4-dihydroxybenzophenone, 2,3,4-trihydroxybenzophenone, alkyl gallates, etc., and examples of the high molecular weight compound include a phenol-formaldehyde novolak resin, a cresol-formaldehyde novolak resin, polyhydroxystyrene, etc.

The photo-sensitive compositions containing the above-described photo-sensitizers usually contain a resin component in addition to those described above. This resin component is a component necessary for providing a uniform and tough coating film to be practically usable as a photoresist or presensitized plate. In addition, the resin component is required to be developable with alkalis. As such a resin, novolak resins are optimum, and a phenol-formaldehyde novolak resin and a cresol-formaldehyde novolak resin have been widely put into practical uses.

These positive type photoresists are generally remarkably excellent in resolving power as compared with photo-curable (negative type) photoresists. Thus, because of this high resolving power, the positive type photoresists have been used as an etching-resisting film (resist film) in photographic etching for the preparation of integrated circuits such as IC or LSI (large scale integrated circuit) or photographically etching a copper-laminated base plate for forming printed circuit.

With respect to the integrated circuits, increasingly high integration degree has now required to form a fine pattern of as narrow as 1 μm. In such fine pattern, film properties of the resist film and its intimate adhesiveness to a base plate are of extreme importance as well as high resolving power. That is, fine lines or patterns of about 1 μm are required to be strongly adhered to the base plate without delamination and formation of pinholes during the steps of developing the resist film and etching. In these regards, conventionally used photoresist compositions, particularly positive type photoresists containing a novolak resin and as a photo-sensitizer a quinonediazide compound, are not fully satisfactory, and therefore, improvements have been demanded. Such insufficiency results from the novolak resin used in the photoresist. In general, in order to obtain a film having good film properties, i.e., the film being a soft, dense and tough thin film, and having good intimate adhesiveness to a base plate, it is required that the composition contains a compound having a molecular weight to a some extent. However, novolak resins have such a defect that the polymerization degree thereof is difficult to increase (a forced increase in the molecular weight would tend to result in gelatin, thus causing difficulty in controlling). Therefore, the resulting film is fragile and shows insufficient adhesiveness to the base plate and insufficient etching resistance, thus being liable to cause various troubles such as delamination of pattern and formation of pinholes. Further, in producing novolak resins, microgels are liable to be formed, which also can lead to formation of pinholes. As other defects of the novolak resins, they have a wide molecular weight distribution and they tend to make a mixture of many isomers. For the use as a photoresist, the molecular weight distribution is desirably narrow, and hence, such novolak resins are usually subjected to separation procedure to obtain novolak resin having a narrow molecular weight distribution. However, this procedure requires much labors and time, and even after the separation procedure, the resulting novolak resins are often still unsatisfactory. An attempt to obtain novolak resins having a narrow molecular weight distribution by controlling the production condition has been found to be not practical due to the difficulty in controlling. The wide molecular weight distribution or presence of a mixture of many isomers causes such a disadvantage that contrast (usually expressed as γ value) which is one of the important properties of photoresist is low. Low contrast results in non-sharp patterns and formation of "reverse trapezoidal" or "semicircular" patterns, which leads to seriously deteriorated resolving power and etching resistance, causing formation of pinholes and reduction in yield.

A further defect of the novolak resin is that quality control of the resin is difficult.

As described hereinbefore, novolak resins, which are liable to be gelled, have a wide molecular weight distribution, and which are liable to contain many isomers, are difficult to produce products with stable quality, and hence, lot-to-lot scatter in resist performance is so wide, which is extremely disadvantageous for users.

On the other hand, the pattern line width goes on becoming finer with an increase of the integration degree of LSI. As one means for achieving it, a dry-etching technique has become popular in place of the conventional wet-etching technique.

There are many and different sorts among the dry-etching techniques. Among them, at present a so-called reactive ion-etching method is most popularly employed. This method is an anisotropic etching method combining a sputtering effect by ions having a directional property with the chemical etching by reactive plasma, and is suitable for obtaining an extremely fine pattern. A characteristic of this method is that: since not only it does not require the treatment of a waste liquor, such as hydrofluoric acid, etc., which is essential in the case of the wet-etching method but also it is free from a side-etching phenomenon which is often found in the wet-etching, a fine pattern can be readily obtained. Further, although it has hitherto been said that the dry-etching has such a defect that the speed of treating a wafer is slow as compared with the wet-etching, this defect is being overcome by improving apparatus to be used and the like. Accordingly, at present the reactive ion-etching method is an indispensable technique in increasing the integration degree.

On the other hand, from the standpoint of resists, the resist per se is being increasingly required to have dry-etching resistance with the spread of the dry-etching technique. In the dry-etching, the resist is required to be enduring, i.e., to keep a sharp pattern shape.

In general, selectivity can be employed as an index of the dry-etching resistance. This is defined to be a ratio of the etching speed of a ground (a species to be etched) to that of a resist, and it is preferred that this ratio is as high as possible.

The selectivity of presently used positive type photo-resists is not always satisfactory, which, however, changes depending on the types of a ground (a species to be etched) and an etching gas. In particular, in the case that the ground is made of aluminum or a specific metal (such as molybdenum or tungsten or silicides thereof), the conditions required for the dry-etching become severe, leading to a reduction in the selectivity, and the presently available positive type photoresists are difficult to have a sufficient dry-etching resistance.

As the result of extensive investigations, the present inventors found that there is an extremely close relationship between the dry-etching resistance and heat resistance. That is, when the heat resistance of the resist is low, it is likely deformed or carbonized during the dry-etching. It may be considered that this is caused by the generation of a considerable amount of heat during the dry-etching.

Further, there is a relationship between the dry-etching resistance and heat resistance in another sense. That is, in order to improve the dry-etching resistance, a method for increasing the temperature of the so-called post-baking which is usually carried out after development but before etching the resist pattern is often employed. Although exact reasons for this are not yet clear, the etching resistance tends to be improved as the post-baking temperature increases. But in the case that the heat resistance of the resist is low, if the post-baking temperature is increased, the resist pattern causes sag or deformation at that stage, and further, these are accelerated at the dry-etching, leading to rendering it impossible to obtain desired etching results.

Accordingly, what the heat resistance is improved is no other than to improve the dry-etching resistance.

SUMMARY OF THE INVENTION

As a result of extensive investigations with the above-described points in mind to obtain a resist composition which possesses good film properties and good adhesiveness, gives a pinhole-free, tough film having a heat resistance and which facilitates quality control of the product, the inventors have found that such can be attained by a combination of an m-hydroxy-α-methylstyrene polymer with as a photo-sensitizer a quinonediazide compound, or a composition prepared by adding an m-hydroxy-α-methylstyrene polymer to a combination of a conventional novolak resin with a photo-sensitizer, thus having completed the present invention.

One object of the present invention is to provide a positive type photoresist composition comprising an m-hydroxy-α-methylstyrene polymer and as a photosensitizer a quinonediazide compound.

Another object of the present invention is to provide a positive type photoresist composition comprising an m-hydroxy-α-methylstyrene polymer, a novolak resin and as a photo-sensitizer a quinonediazide compound.

DETAILED DESCRIPTION OF THE INVENTION

An m-hydroxy-α-methylstyrene polymer which can be used in the present invention is an isopropenylphenol homo- or copolymer having repeating units represented by the following formula:

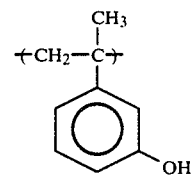

Polymers having an isopropenylphenol as a monomer unit are disclosed in, for example, Japanese Patent Publication No. 16061/73, Japanese Patent Application (OPI) No. 50393/77, German Patent No. 1,004,168, etc. (OPI herein used means an unexamined published Japanese patent application.) These polymers are all low molecular weight polymers having a molecular weight of about 300 to about 3,000. In contrast, Japanese Patent Application No. 161412/81 discloses high molecular weight polymers having a weight average molecular weight of $5 \times 10^4$ to $5 \times 10^5$. Of these, m-hydroxy-α-methylstyrene polymers suited for the present invention are those having a molecular weight of 1,000 to 100,000. The use of m-hydroxy-α-methylstyrene polymers having a molecular weight falling within this range affords a pinhole-free, tough film which enables one to form a pattern with high resolving power and which shows, after formation of resist pattern, remarkably improved intimate adhesiveness to a base plate, without deteriorating the developability of positive type photoresist.

The content of m-hydroxy-α-methylstyrene in the m-hydroxy-α-methylstyrene copolymer is generally 20% or more. As a comonomer which can be used, any monomer can be used so long as the resulting copolymer is developable with alkalis, soluble in a solvent used for the resist composition, and well compatible with other components used in the resist composition. Examples of the comonomer which can be used include styrene derivatives (e.g., styrene, hydroxystyrene, α-methylstyrene, etc.), acrylic acid derivatives (e.g., acrylic acid, methyl acrylate, ethyl acrylate, butyl acrylate, etc.), methacrylic acid derivatives (e.g., methyl methacrylate, ethyl methacrylate, butyl methacrylate, etc.), and the like.

In using such m-hydroxy-α-methylstyrene polymer in combination with the novolak resin, it is preferred that the m-hydroxy-α-methylstyrene polymer is used in an amount of 1 wt % or more based on the weight of the novolak resin.

Since the m-hydroxy-α-methylstyrene polymer is well compatible with the novolak resin and quinonediazide compound, developable with alkalis, and soluble in a solvent usually used for photoresists such as cellosolve, cellosolve acetate, butyl acetate, methyl isobutyl ketone, xylene, etc., they can be suitably used as photoresists.

In addition, in comparison with novolak resins, the m-hydroxy-α-methylstyrene polymer is excellent in quality stability when taking into account the polymerization behavior thereof. That is, such polymer facilitates quality control of the product. Further, the m-hydroxy-α-methylstyrene polymer is also so preferable that it affords a coating film having good film properties and intimate adhesiveness without adversely affecting sensitivity, contrast, resolving power, image reproducibility, etc. which photoresists should essentially possess.

Then, the photo-sensitizer which can be used will be described below. A quinonediazido group-containing photo-sensitizer component can be obtained by reacting naphthoquinonediazide-sulfonyl chloride or benzoquinonediazide-sulfonyl chloride with a low molecular weight or high molecular weight compound having a functional group capable of undergoing condensation reaction with an acid chloride. As the functional group capable of undergoing the condensation reaction with an acid chloride, there are illustrated a hydroxy group, an amino group, etc., with the hydroxy group being preferable. Examples of low molecular weight compounds containing a hydroxy group include hydroquinone, resorcinol, phloroglucinol, 2,4-dihydroxybenzophenone, 2,3,4-trihydroxybenzophenone, alkyl gallates, etc. and examples of high molecular weight compounds containing a hydroxy group include a phenol-formaldehyde novolak resin, a cresol-formaldehyde novolak resin, polyhydroxystyrene, polyhydroxy-α-methylstyrene, etc.

A suitable ratio of the above-described photo-sensitizer component to the m-hydroxy-α-methylstyrene polymer is in the range of 1:1 to 1:6 by weight.

In case of using a novolak resin in combination, a suitable ratio of the photo-sensitizer component to the sum of the m-hydroxy-α-methylstyrene polymer and the novolak resin is in the range of 1:1 to 1:6 by weight.

The above described components are dissolved in a solvent to prepare a resist solution. Suitable examples of the solvent which can be used are those which can evaporate at a suitable drying rate to provide a uniform and smooth coating film. As such solvents, methyl cellosolve, ethyl cellosolve, methyl cellosolve acetate, ethyl cellosolve acetate, butyl acetate, methyl isobutyl ketone, xylene, etc. can be used. These solvents can be used either alone or in combination.

The positive type photoresist composition of the present invention can further contain small amounts of additives, such as resin, a plasticizer, a pigment, etc.

The photoresist composition of the present invention can show high resolving power, high heat resistance and extremely good intimate adhesiveness to a base plate and form less pinholes, and hence, it can be used for the preparation of LSI with a pattern of approximately 1 μm. In addition, it can find other various applications including shadow mask processing, color filter processing for CCD (charge coupled device), printed circuit processing, presensitized lithographic plate processing, etc.

The present invention will now be described in more detail by the following Examples which, however, should not be construed as limiting the present invention in any way.

EXAMPLE 1

| | | |
|---|---|---|
| (1) | Photo-sensitizer (a condensation reaction product between naphthoquinone-(1,2)-diazide-(2)-5-sulfonyl chloride and 2,3,4-trihydroxybenzophenone) | 7 g |
| (2) | Poly-m-hydroxy-α-methylstyrene (weight average molecular weight: about 8,000) | 17 g |
| (3) | Dye (Sumiplast Red AS; made by SUMITOMO CHEMICAL COMPANY, LIMITED.) | 0.15 g |
| (4) | Solvent | 64 g |
| | ethyl cellosolve acetate: 80 wt % | |
| | xylene: 10 wt % | |
| | n-butyl acetate: 10 wt % | |

The above-described composition was filtered through a 0.2 μm filter to prepare a resist solution. This solution was coated on a silicone wafer which had been washed in a conventional manner using a rotary coater and dried for 30 minutes in a clean oven at 80° C. The thus formed coating film had a thickness of 1.25 μm. The assembly was then exposed for 8 seconds through a mask having a minimum line width of 1.0 μm using a contact mask aligner containing a 350-W super-high pressure mercury vapor lamp as a light source. The thus exposed assembly was dipped in a 0.25 N potassium hydroxide aqueous solution, followed by developing. After the development, the resulting pattern was surveyed under a microscope to find that a 1.0-μm pattern was formed with good reproducibility and good intimate adhesiveness to the wafer. In addition, no cracks and pinholes were found in the film. Thus, the film showed good film properties.

On the other hand, the same procedure was conducted using an alkali-soluble phenol-formaldehyde novolak resin in place of the poly-m-hydroxy-α-methylstyrene (2) for comparison. As the result, it was found that lines to 4-μm or narrower width partly delaminated.

EXAMPLE 2

| | | |
|---|---|---|
| (1) | Photo-sensitizer (a condensation reaction product between naphthoquinone-(1,2)-diazide-(2)-5-sulfonyl chloride and 2,3,4-trihydroxybenzophenone) | 7 g |
| (2) | Poly-m-hydroxy-α-methylstyrene copolymer (weight average molecular weight: about 10,000; butyl acrylate content: 20 wt %) | 17 g |
| (3) | Dye (Sumiplast Red AS; made by SUMITOMO CHEMICAL COMPANY, LIMITED) | 0.15 g |
| (4) | Solvent | 64 g |
| | ethyl cellosolve acetate: 80 wt % | |
| | xylene: 10 wt % | |
| | n-butyl acetate: 10 wt % | |

The above-described composition was filtered through a 0.2-μm filter and coated on a silicone wafer in the same manner as in Example 1 to obtain a pinhole-free, tough film. Then, the exposure and development were conducted in the same manner as in Example 1 to form a 1.0-μm pattern on the wafer with good reproducibility and good intimate adhesiveness to the wafer.

EXAMPLE 3

| | | |
|---|---|---|
| (1) | Alkali-soluble phenol-formaldehyde novolak resin | 17 g |
| (2) | Photo-sensitizer (a condensation reaction product between naphthoquinone-(1,2)-diazide-(2)-5-sulfonyl chloride and 2,3,4-trihydroxybenzophenone) | 7 g |
| (3) | Poly-m-hydroxy-α-methylstyrene (weight average molecular weight: 50,000) | 2 g |
| (4) | Dye (Sumiplast Red AS; made by SUMITOMO CHEMICAL COMPANY, LIMITED) | 0.15 g |
| (5) | Solvent<br>ethyl cellosolve acetate: 80 wt %<br>xylene: 10 wt %<br>n-butyl acetate: 10 wt % | 64 g |

The above-described composition was filtered through a 0.2-μm filter and coated on a silicone wafer in the same manner as in Example 1 to obtain a pinhole-free, tough film. Then, the exposure and development were conducted in the same manner as in Example 1 to form a 1.0-μm pattern on the wafer with good reproducibility and good intimate adhesiveness.

EXAMPLE 4

| | | |
|---|---|---|
| (1) | Alkali-soluble phenol-formaldehyde novolak resin | 17 g |
| (2) | Photo-sensitizer (a condensation reaction product between naphthoquinone-(1,2)-diazide-(2)-5-sulfonyl chloride and 2,4-dihydroxybenzophenone) | 7 g |
| (3) | Poly-m-hydroxy-α-methylstyrene copolymer (weight average molecular weight: about 50,000; butyl acrylate content: 30 wt %) | 2 g |
| (4) | Dye (Sumiplast Red AS; made by SUMITOMO CHEMICAL COMPANY, LIMITED) | 0.15 g |
| (5) | Solvent<br>ethyl cellosolve acetate: 80 wt %<br>xylene: 10 wt %<br>n-butyl acetate: 10 wt % | 64 g |

The above described composition was filtered through a 0.2-μm filter, and coated, exposed and developed in the same manner as in Example 1. Thus, a 1.0-μm pattern was formed on the wafer with good reproducibility and good intimate adhesiveness to the wafer.

EXAMPLE 5 AND COMPARATIVE EXAMPLE 1

Each of the compositions shown in Table 1 was filtered through a 0.2 μm filter to prepare a resist solution. This solution was coated on a silicone wafer which had been washed in a conventional manner using a rotary coater. The revolution number of the coater was adjusted such that the coating film had a thickness of 1.25 μm. The assembly was placed in a clean oven at 80° C. and dried for 30 minutes, and then exposed through a mask having a minimum line width of 1.0 μm using a contact mask aligner containing a 350-W super-high pressure mercury vapor lamp as a light source. The thus exposed assembly was dipped in a positive type photoresist developer (SOPD, mad by SUMITOMO CHEMICAL COMPANY, LIMITED.) and developed to form a pattern. The thus pattern-formed silicone wafer was placed in a clean oven at a prescribed temperature for 30 minutes and surveyed using a scanning-type electron microscope to evaluate the presence or absence of heat deformation of the pattern. The heat treatment temperature by the clean oven was changed with every 10° C., and the temperature just before the heat deformation was observed was determined as the heat resistance. The results are shown in Table 1. It is clear from this table that the composition of Example 5 was markedly superior in the heat resistance to that of Comparative Example 1.

TABLE 1

| | Resin | | | Photo-sensitizer[2] (g) | Additive[3] (g) | Dye[4] (g) | Solvent[5] (g) | Heat Resistance (°C.) |
|---|---|---|---|---|---|---|---|---|
| | Component | Molecular Weight[1] | Amount (g) | | | | | |
| Example 5 | Poly-m-hydroxy-α-methylstyrene | 4780 | 17 | 6 | 1.0 | 0.15 | 67 | 220 |
| Comparative Example | Cresol-Formaldehyde Novolak Resin | 7200 | 17 | 6 | 1.0 | 0.15 | 55 | 120 |

[1]weight average molecular weight obtained by GPC
[2]condensation reaction product between naphthoquinone-(1,2)-diazide-(2)-5-sulfonyl chloride and trihydroxybenzophenone
[3]Sumiepoxy ESCN-220F; made by SUMITOMO CHEMICAL COMPANY, LIMITED.
[4]Sumiplast Red AS, made by SUMITOMO CHEMICAL COMPANY, LIMITED.
[5]ethyl cellosolve acetate/n-butyl acetate/xylene = 8/1/1

While the invention has been described in detail and with reference to specific embodiments thereof, it will be apparent to one skilled in the art that various changes and modifications can be made therein without departing from the spirit and scope thereof.

What is claimed is:

1. A positive type alkali-developable photoresist composition comprising in admixture an m-hydroxy-α-methylstyrene homopolymer and, as a photo-sensitizer, a quinonediazide compound, wherein the photo-sensitizer and the m-hydroxy-α-methylstyrene homopolymer are present in a ratio of in the range of 1:1 to 1:6 by weight.

2. A positive type alkali-developable photoresist composition comprising in admixture an m-hydroxy-α-methylstyrene homopolymer, a novolak resin, and, as a photo-sensitizer, a quinonediazide compound, wherein the photo-sensitizer component and the sum of the m-hydroxy-α-methylstyrene homopolymer and the novolak resin are present in a ratio in the range of 1:1 to 1:6 by weight with the amount of the m-hydroxy-α-methylstyrene polymer being 11 wt % or more based on the weight of novolak resin.

* * * * *